(12) United States Patent
Kang

(10) Patent No.: US 7,586,365 B2
(45) Date of Patent: Sep. 8, 2009

(54) APPARATUS FOR CONTROLLING VOLTAGE

(75) Inventor: Dong Keum Kang, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 11 days.

(21) Appl. No.: 11/819,250

(22) Filed: Jun. 26, 2007

(65) Prior Publication Data

US 2008/0036519 A1 Feb. 14, 2008

(30) Foreign Application Priority Data

Aug. 11, 2006 (KR) ................ 10-2006-0076119

(51) Int. Cl.
*G05F 1/10* (2006.01)
(52) U.S. Cl. .................... 327/538; 327/534
(58) Field of Classification Search ............ 327/534, 327/538, 540
See application file for complete search history.

(56) References Cited

U.S. PATENT DOCUMENTS

| 4,352,092 A * | 9/1982 | Masuda et al. ............ 341/136 |
| 5,426,616 A * | 6/1995 | Kajigaya et al. ............ 365/226 |
| 5,451,896 A | 9/1995 | Mori |
| 5,682,118 A * | 10/1997 | Kaenel et al. ............ 327/534 |
| 6,255,895 B1 * | 7/2001 | Kim et al. ............ 327/530 |
| 6,348,831 B1 * | 2/2002 | Baba ............ 327/537 |
| 6,621,284 B2 * | 9/2003 | D'Angelo ............ 324/763 |
| 6,628,159 B2 * | 9/2003 | Voldman ............ 327/534 |
| 7,038,525 B2 * | 5/2006 | Kato ............ 327/437 |
| 7,352,230 B2 * | 4/2008 | An ............ 327/334 |
| 2005/0231269 A1 | 10/2005 | Kim et al. |
| 2005/0280437 A1 * | 12/2005 | Lewis et al. ............ 326/38 |
| 2006/0038607 A1 * | 2/2006 | Wada ............ 327/538 |
| 2006/0091938 A1 | 5/2006 | Kim |
| 2006/0120196 A1 * | 6/2006 | Jeon et al. ............ 365/226 |

FOREIGN PATENT DOCUMENTS

| KR | 1020020006060 | 1/2002 |
| KR | 1020050100817 | 10/2005 |
| KR | 1020070025000 | 3/2007 |

* cited by examiner

*Primary Examiner*—Lincoln Donovan
*Assistant Examiner*—Thomas J Hiltunen
(74) *Attorney, Agent, or Firm*—Venable LLP; Jeffri A. Kaminski

(57) ABSTRACT

An apparatus for controlling a voltage includes a reference voltage generator that generates reference voltage, and a bulk bias voltage generator that generates a bulk bias voltage using the reference voltage supplied by the reference voltage generator, and supplies the bulk bias voltage to the reference voltage generator to control the reference voltage.

13 Claims, 2 Drawing Sheets

APPARATUS FOR CONTROLLING VOLTAGE

CROSS-REFERENCE TO RELATED PATENT APPLICATION

This application claims the benefit of Korean Patent Application No. 10-2006-0076119, filed on Aug. 11, 2006, in the Korean Intellectual Property Office, the disclosure of which is incorporated herein in its entirety by reference.

BACKGROUND OF THE INVENTION

1. Technical Field

The present invention relates to a semiconductor integrated circuit, and more particularly, to an apparatus for controlling a voltage in the semiconductor integrated circuit.

2. Related Art

As the integration of semiconductor memory apparatuses increases, a separate voltage is used in a core region to reduce power consumption or an elevated voltage for performing an overdriving operation is used to access data at a high speed. In recent years, internal voltages having various voltage levels have been generated and used in the semiconductor memory apparatus. In order to generate internal voltages having varied voltage levels, a semiconductor memory apparatus includes a reference voltage generating circuit that supplies a reference voltage VREF.

In general, a reference voltage generating circuit or an internal voltage generating circuit includes a switch that transmits a generated voltage to a predetermined portion in the semiconductor memory apparatus. This switch may be a PMOS transistor. However, in a general PMOS transistor, when a temperature is decreased, a threshold voltage Vth is increased. For this reason, the current supply capability of the PMOS transistor that operates with the switch is lowered, and thus a level of a reference voltage (or an internal voltage) is changed. As a result, it is difficult to secure the reference voltage (or the internal voltage) accurately due to the variation in the reference voltage or (the internal voltage). Furthermore, in order not to use the switch composed of the PMOS transistor, a new reference voltage generating circuit or internal voltage generating circuit needs to be designed, which causes not only inconvenience but also an increase in manufacturing costs due to a new circuit design.

SUMMARY OF THE INVENTION

Embodiments of the present invention provide an apparatus for controlling a voltage that is capable of generating a constant reference voltage or internal voltage even when a temperature varies.

An embodiment of the present invention provides an apparatus for controlling a voltage. The apparatus includes a reference voltage generator that generates a reference voltage, and a bulk bias voltage generator that generates a bulk bias voltage using the reference voltage supplied by the reference voltage generator, and supplies the bulk bias voltage to the reference voltage generator to control the reference voltage.

Another embodiment of the present invention provides an apparatus for controlling a voltage. The apparatus includes a voltage trimming unit that is applied with a first voltage to generate a plurality of distributed voltages, and transmits the distributed voltages to output nodes in response to a bulk bias voltage and a plurality of trimming signals so as to output a reference voltage, a trimming signal generating unit that outputs the plurality of trimming signals, and activates one of the plurality of trimming signals in response to a specific mode, and a switching unit in which an amount of current flowing through the switching unit varies according to varied levels of the reference voltage, and a distributing unit that distributes an external voltage and outputs the bulk bias voltage.

DESCRIPTION OF EXEMPLARY EMBODIMENTS

Embodiments of the present invention will now be described in detail with reference to the accompanying drawings.

Figure 1:
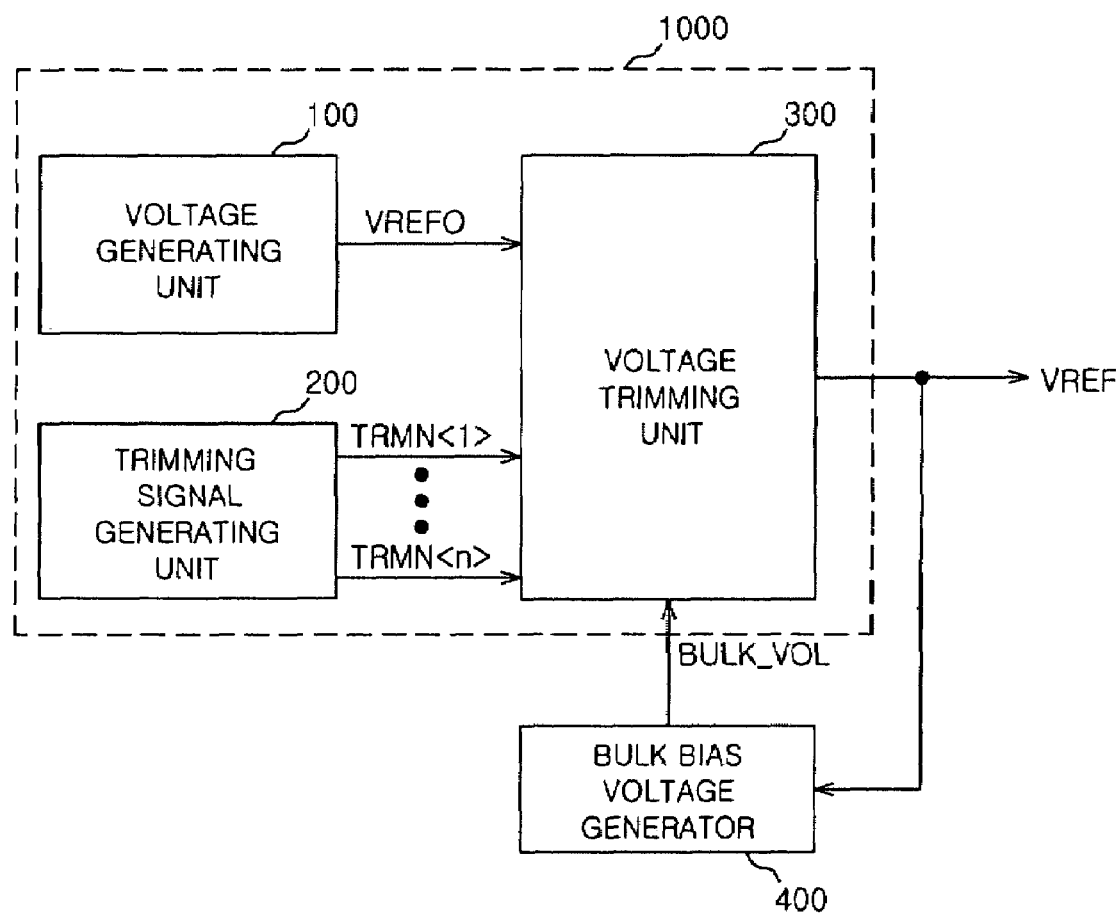
FIG. 1 is a block diagram illustrating an apparatus for controlling a voltage according to an embodiment of the present invention.

Referring to FIG. 1, an apparatus for controlling a voltage according to an embodiment of the present invention includes a reference voltage generator 1000 and a bulk bias voltage generator 400.

The reference voltage generator 1000 includes a voltage generating unit 100, a trimming signal generating unit 200, and a voltage trimming unit 300.

The voltage generating unit 100 generates a first voltage VREFO. The voltage generating unit 100 can be implemented by a general voltage generating circuit or reference voltage generating circuit.

The trimming signal generating unit 200 outputs a plurality of trimming signals TRMN<1:n>, and activates one trimming signal TRMN<i> in response to a specific mode. Reference character n denotes a natural number of 1 or more, and reference character i denotes a natural number in a range of 1 to n.

Figure 2:
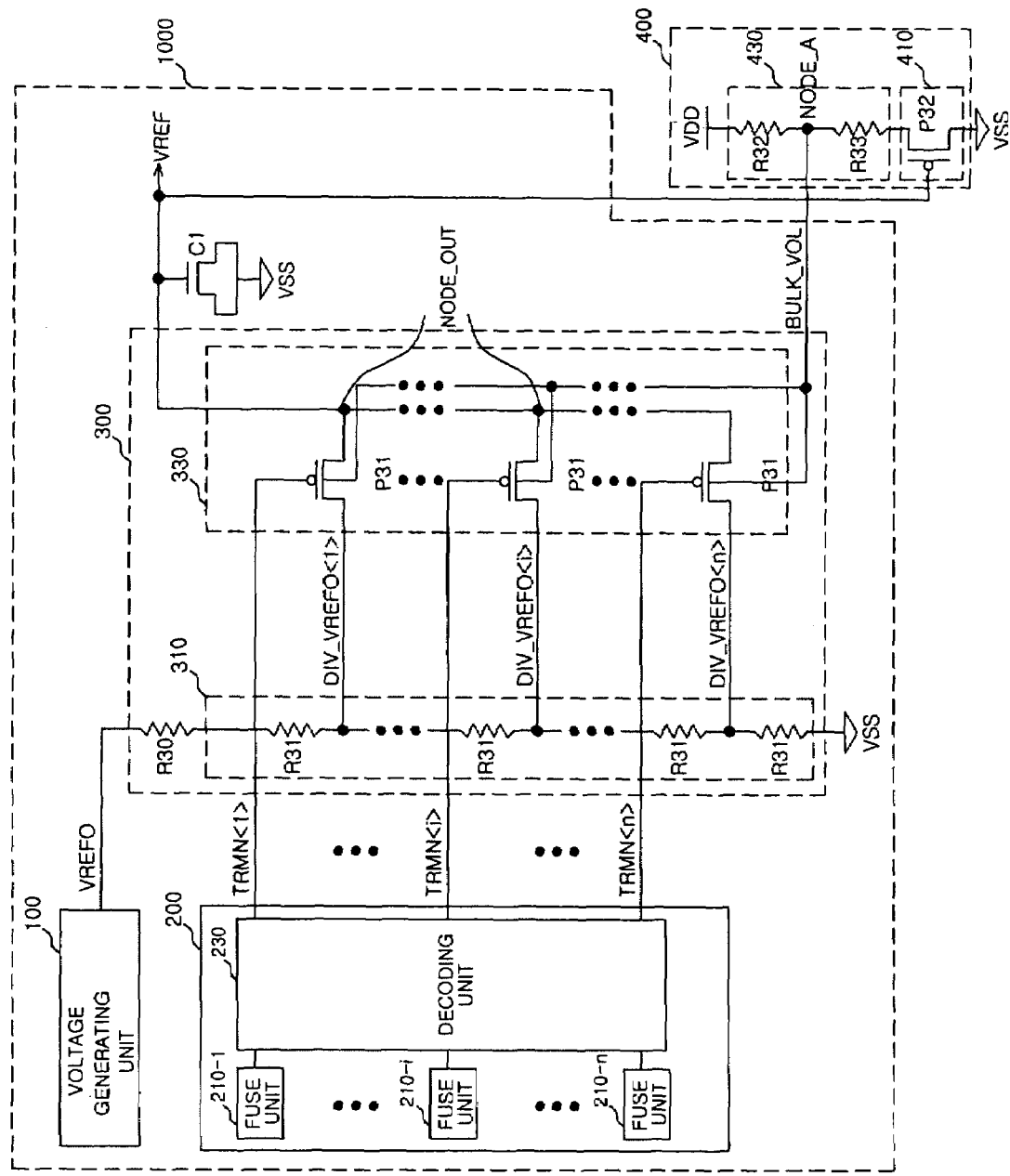
FIG. 2 is a circuit diagram specifically illustrating the apparatus for controlling a voltage shown in FIG. 1.

Specifically, the trimming signal generating unit 200 includes a plurality of fuse units 210-1 to 210-n and a decoding unit 230, as shown in FIG. 2.

The plurality of fuse units 210-1 to 210-n cut fuses in response to the specific mode. The decoding unit 230 decodes output signals of the plurality of fuse units 210-1 to 210-n and outputs decoding results as the trimming signals TRMN<1:n>.

The voltage trimming unit 300 is applied with the first voltage VREFO to generate a plurality of distributed voltages, and transmits the distributed voltages as reference voltage to output nodes in response to a bulk bias voltage BULK_VOL and the trimming signals TRMN<1:n>.

Specifically, the voltage trimming unit 300 includes a resistor portion R30, a voltage distributing portion 310, and a voltage transmitting portion 330, as shown in FIG. 2.

The resistor portion R30 drops the first voltage VREFO supplied by the voltage generating unit 100 down to a predetermined voltage. Therefore, the distributed voltages DIV_VREFO<1:n> have arbitrary values, respectively.

The voltage distributing portion 310 distributes the first voltage VREFO, which is dropped by a predetermined voltage, to output the plurality of distributed voltages DIV_VREFO<1:n>.

The voltage distributing portion 310 includes a plurality of first resistor elements R31. The plurality of first resistor elements are connected in series between the resistor R30 and a ground voltage source of VSS.

The distributed voltages DIV_VREFO<1:n> are generated at connection portions of the plurality of first resistor elements of R31, respectively.

The voltage transmitting portion 330 is applied with the bulk bias voltage BULK_VOL from the bulk bias voltage generator 400 and transmits the distributed voltages DIV_VREFO<1:n> to the output node NODE_OUT in response to the trimming signals TRMN<1:N> so as to transmit the reference voltage.

The voltage transmitting portion 330 may be composed of a plurality of first PMOS transistors P31. Each of the plurality of first PMOS transistors P31 includes a gate that receives a corresponding trimming signal TRMN<1:n>, a source that is supplied with a corresponding distributed voltage DIV_VREFO<1:n>, and a drain that is connected to a corresponding output node NODE_OUT. Each of the plurality of first PMOS transistors P31 includes a bulk terminal that is supplied with the bulk bias voltage BULK_VOL.

The output node NODE_OUT outputs the distributed voltage DIV_VREFO<1:n>, which is transmitted by the voltage transmitting portion 330, as a reference voltage VREF.

The bulk bias voltage generator 400 generates the bulk bias voltage BULK_VOL on which a level of the reference voltage VREF is reflected.

The bulk bias voltage generator 400 will be described in detail with reference to FIG. 2. The bulk bias voltage generator 400 includes a switching unit 410 and a distributing unit 430.

The switching unit 410 varies the amount of current that flows through the switching unit 410 according to a changed level of the reference voltage VREF.

Since the potential of first node NODE_A varies according to the amount of current that flows through the switching unit 410, the bulk bias voltage BULK_VOL, to which the voltage of the first node NODE_A is supplied to, varies according to the amount of current that flows through the switching unit 410.

The switching unit 410 includes a second PMOS transistor P32 that has a gate input with the reference voltage VREF, a source connected to the distributing unit 430, and a drain applied with the ground voltage from the ground voltage source VSS.

The distributing unit 430 distributes an external voltage from the external voltage source VDD and to output the bulk bias voltage BULK_VOL.

The distributing unit 430 includes second and third resistor elements of R32 and R33 connected between an input terminal of the external voltage source VDD and the switching unit 410. In this case, the first node NODE_A is at a connection between the second and third resistor elements of R32 and R33.

The switching unit 410 may be replaced by a switching element that connects the distributing unit 430 and the ground voltage source VSS in response to the reference voltage VREF. It should be understood that the switching unit 410 is not limited to the second PMOS transistor P32.

A capacitor C1 is connected between the output node NODE_OUT and the ground voltage source, and causes the reference voltage VREF to be a stable output.

The operation of the apparatus for controlling a voltage according to an embodiment of the present invention is described with reference to FIGS. 1 and 2.

The voltage generating unit 100 generates the first voltage VREFO to be constant, and the trimming signal generating unit 200 activates one signal TRMN<i> of the trimming signals TRMN<1:n> according to the specific mode. For example, the trimming signal TRMN<i>, which is activated in a mode in which the reference voltage VREF used to generate an elevated potential voltage VPP is generated, but that is different from the trimming signal TRMN<i>, which is activated in a mode in which the reference voltage VREF used to generate a bulk voltage VBB is generated.

The voltage trimming unit 300 distributes the first voltage VREFO so as to generate the plurality of distributed voltages DIV_VREFO<1:n>, and outputs the distributed voltages DIV_VREFO<1:n> as the reference voltage VREF in response to the trimming signals TRMN<1:n>. Further, the bulk bias voltage generator 400 generates the bulk bias voltage BULK_VOL, supplies it to a body of the first PMOS transistor P31, to compensate for the variation in the reference voltage VREF in response to the variation in temperature and process of the first PMOS transistor P31 that is included in the voltage trimming unit 300.

Specifically, a fuse, which is included in a specific fuse unit 210_i among the plurality of fuse unit 210-1 to 210-n, is cut in response to the specific mode. The decoding unit 230 decodes output signals of the fuse units 210-1 to 210_n and outputs the plurality of trimming signals TRMN<1:n>. At this time, one trimming signal TRMN<i> among the plurality of trimming signals TRMN<1:n> is activated.

The voltage distributing portion 310 generates the plurality of distributed voltages DIV_VREFO<1:n> according to the resistance ratio among the plurality of resistors R31. The voltage transmitting portion 330 transmits the distributed voltages DIV_VREFO<i> to the output node NODE_OUT in response to the trimming signals TRMN<i>.

Since a threshold voltage Vth is increased due to the variance of temperature and process in the first PMOS transistor P31 of the voltage transmitting portion 330, the first PMOS transistor P31 is not able to transmit the distributed voltage DIV_VREFO<1:n> sufficiently to the output node NODE_OUT. Therefore, the output node NODE_OUT outputs a relatively lowered reference voltage VREF. If the threshold voltage Vth of the first PMOS transistor P31 is decreased, a large amount of distributed voltage DIV_VREFO<1:n> is transmitted to the output node NODE_OUT through the first PMOS transistor P31, and a relatively increased reference voltage VREF is output.

As such, if the reference voltage VREF is increased, a gate voltage of the switching unit 410 of the bulk bias voltage generator 400 is increased, and a relatively small amount of current flows through the switching unit 410. Accordingly, a potential of the first node NODE_A of the bulk bias voltage generator 400 increases, and the increased bulk bias voltage BULK_VOL is supplied to the voltage transmitting portion 330.

Meanwhile, when the reference voltage VREF is reduced, the gate voltage of the switching unit 410 of the bulk bias voltage generator 400 is decreased, and a relatively large amount of current flows through the switching unit 410.

Accordingly, the potential of the first node NODE_A of the bulk bias voltage generator 400 decreases, and a relatively decreased bulk bias voltage BULK_VOL is supplied to the voltage transmitting portion 330.

The bulk bias voltage BULK_VOL is applied to a body of the first PMOS transistor P31 that constitutes the voltage transmitting portion 330, and allows the distributed voltage DIV_VREFO<1:n> to be constantly transmitted to the output node NODE_OUT, even when voltage transmission characteristics of the first PMOS transistor P31 are changed due to the temperature and its process.

As described above, the apparatus for controlling a voltage according to an embodiment of the present invention decreases the bulk bias voltage BULK_VOL applied to the first PMOS transistor P31 when the reference voltage VREF is decreased, and increases the bulk bias voltage BULK_VOL applied to the first PMOS transistor P31 when the reference voltage VREF is increased. Therefore, even when the temperature and the process vary, the first PMOS transistor P31 can transmit the distributed voltage DIV_VREFO<1:n> having the predetermined level. Accordingly, if a current driving capability of the first PMOS transistor P31 is appropriately controlled, even though the temperature and the process vary, it is possible to output a level of the reference voltage VREF that seldom varies.

The voltage generating unit 100 according to an embodiment of the present invention generates the first voltage VREFO, and the voltage trimming unit 300 distributes the first voltage VREFO and outputs the reference voltage VREF. However, since types of output voltages are changed according to particular designs, the output voltage according to an embodiment of the present invention can be applied to a case where in addition to the reference voltage, the internal voltage is generated.

It will be apparent to those skilled in the art that various modifications and changes may be made without departing from the scope and spirit of the present invention. Therefore, it should be understood that the above embodiments are not limitative, but illustrative in all aspects. The scope of the present invention is defined by the appended claims rather than by the description preceding them, and therefore all changes and modifications that fall within metes and bounds of the claims, or equivalents of such metes and bounds are therefore intended to be embraced by the claims.

What is claimed is:

1. An apparatus for controlling a voltage, the apparatus comprising:
    a trimming signal generating unit that outputs a plurality of trimming signals, and activates one of the plurality of trimming signals in response to a specific mode;
    a voltage trimming unit that is applied with a first voltage to generate a plurality of distributed voltages, and transmits the distributed voltages to output nodes in response to a bulk bias voltage and the plurality of trimming signals so as to output a reference voltage;
    a switching unit in which an amount of current flowing through the switching unit varies according to changed levels of the reference voltage; and
    a distributing unit that distributes an external voltage and outputs the bulk bias voltage.

2. The apparatus of claim 1,
wherein the reference voltage generator further includes a voltage generating unit that generates the first voltage.

3. The apparatus of claim 1,
wherein the trimming signal generating unit includes:
    a plurality of fuse units that cut fuses in response to the specific mode and provide output signals; and
    a decoding unit that decodes the output signals of the fuse units and outputs the trimming signals.

4. The apparatus of claim 1,
wherein the voltage trimming unit includes:
    a voltage distributing portion that distributes the first voltage and outputs the plurality of distributed voltages; and
    a voltage transmitting portion that is applied with the bulk bias voltage, and transmits the distributed voltages to the output nodes in response to the trimming signals.

5. The apparatus of claim 4,
wherein the voltage trimming unit further includes a resistor portion that drops the first voltage to a predetermined voltage.

6. The apparatus of claim 5,
wherein the voltage distributing portion includes a plurality of resistor elements connected in series between the resistor portion and a ground voltage source and which distributes the first voltage.

7. The apparatus of claim 6,
wherein the resistor elements have at least one end connected to an end of another resistor element and the distributed voltages are output from the connected ends of the resistor elements.

8. The apparatus of claim 4,
wherein the voltage transmitting portion includes a plurality of PMOS transistors that transmit the distributed voltages to the output nodes in response to the trimming signals.

9. The apparatus of claim 8,
wherein the plurality of PMOS transistor each have a body and the bulk bias voltage is applied to the body of each of the plurality of PMOS transistors.

10. The apparatus of claim 1,
wherein the bulk bias voltage varies according to an amount of current that flows through the switching unit.

11. The apparatus of claim 10,
wherein the switching unit includes a PMOS transistor that has a gate applied with the reference voltage, a source connected to the distributing unit, and a drain applied with a ground voltage.

12. The apparatus of claim 1,
wherein the distributing unit includes:
a first resistor element connected between an input terminal for the external voltage and a first node; and
a second resistor element connected between the first node and the PMOS transistor, and wherein
the distributing unit outputs the bulk bias voltage at the first node.

13. The apparatus of claim 1, further comprising:
    a capacitor connected between the output nodes and a ground voltage source.

* * * * *